US011406019B2

(12) United States Patent
Chu

(10) Patent No.: US 11,406,019 B2
(45) Date of Patent: Aug. 2, 2022

(54) FIXING DEVICE AND ELECTRONIC DEVICE USING THE SAME

(71) Applicant: ASUSTeK COMPUTER INC., Taipei (TW)

(72) Inventor: Hsu-Ching Chu, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 84 days.

(21) Appl. No.: 16/992,267

(22) Filed: Aug. 13, 2020

(65) Prior Publication Data

US 2021/0068257 A1 Mar. 4, 2021

(30) Foreign Application Priority Data

Aug. 29, 2019 (TW) ................................ 108131125

(51) Int. Cl.
| G06F 1/18 | (2006.01) |
| H05K 1/18 | (2006.01) |
| F16M 13/02 | (2006.01) |
| H05K 7/14 | (2006.01) |
| H05K 1/14 | (2006.01) |

(52) U.S. Cl.
CPC ............. *H05K 1/181* (2013.01); *F16M 13/02* (2013.01); *G06F 1/185* (2013.01); *H05K 1/141* (2013.01); *H05K 7/1418* (2013.01); *H05K 7/1429* (2013.01); *H05K 2201/10128* (2013.01); *H05K 2201/10598* (2013.01)

(58) Field of Classification Search
CPC ......... H05K 1/181; H05K 2201/10128; H05K 2201/10598; H05K 2201/10409; H05K 2201/10424; H05K 2201/10606; H05K 2201/2072; H05K 2203/167; H05K 3/366; H05K 1/141; H05K 2201/044; H05K 2201/048; H05K 2201/09081; H05K 2201/09127; H05K 7/1418; H05K 7/1429; F16M 13/02; G06F 1/185; G06F 1/186

See application file for complete search history.

(56) References Cited

U.S. PATENT DOCUMENTS

| 6,236,574 B1 * | 5/2001 | Han ..................... H05K 9/0022 361/816 |
| 6,331,940 B1 * | 12/2001 | Lin ...................... H05K 7/1431 361/785 |
| 7,102,895 B1 * | 9/2006 | Copple ................ H05K 7/1418 361/759 |

(Continued)

FOREIGN PATENT DOCUMENTS

| CN | 207780689 U | 8/2018 |
| CN | 109300745 A | 2/2019 |
| TW | I359347 B | 3/2012 |

*Primary Examiner* — Steven T Sawyer
(74) *Attorney, Agent, or Firm* — McClure, Qualey & Rodack, LLP

(57) ABSTRACT

A fixing device for fixing a display card on a circuit board, includes a backplane and a support bracket. The backplane includes a substrate plate, and a first engaging part. The substrate plate is fixed on the display card. The first engaging part is disposed on the substrate plate. The support bracket includes at least one support leg and a second engaging part. The support leg includes a first end and a second end. The first end is connected with the circuit board. The second engaging part is connected with the second end and engaged with the first engaging part.

16 Claims, 6 Drawing Sheets

(56) References Cited

U.S. PATENT DOCUMENTS

| | | |
|---|---|---|
| 8,130,489 B2 | 3/2012 | Chan et al. |
| 2011/0228462 A1* | 9/2011 | Dang .................. H05K 7/1429 361/679.4 |
| 2012/0134091 A1* | 5/2012 | Zhang .................... G06F 1/185 361/679.32 |
| 2013/0288532 A1* | 10/2013 | Lai .......................... G06F 1/185 439/629 |

* cited by examiner

FIXING DEVICE AND ELECTRONIC DEVICE USING THE SAME

CROSS-REFERENCE TO RELATED APPLICATION

This application claims the priority benefit of Taiwan applications serial No. 108131125, filed on Aug. 29, 2019. The entirety of the above-mentioned patent application is hereby incorporated by reference herein and made a part of specification.

BACKGROUND OF THE INVENTION

Field of the Invention

The invention relates to a fixing device and an electronic device.

Description of the Related Art

A display card is one of the basic components of a personal computer, and it provides a scan signal to the display for displaying the required image. However, the display card does not have any supporting structure, so when the display card is plugged into the slot on the circuit board, the weight of the display card is fully borne by the slot.

Since the slot bears the gravity of the display card for a long time, the slot and the circuit board are damaged easily. In addition, during the transporting process, the electronic device is inevitably shaken and swayed. When the transportation shakes violently, the display card may break away with the slot, which may cause the display card to collide with the chassis and be damaged.

BRIEF SUMMARY OF THE INVENTION

According to the first aspect, a fixing device for fixing a display card on a circuit board is provided. The fixing device includes a backplane and a support bracket. The backplane includes a substrate plate, and a first engaging part. The substrate plate is fixed on the display card. The first engaging part is disposed on the substrate plate. The support bracket includes at least one support leg and a second engaging part. The support leg includes a first end and a second end. The first end is connected with the circuit board. The second engaging part is connected with the second end and engaged with the first engaging part.

According to the second aspect, an electronic device with a display card is also provided. The electronic device includes a circuit board and a fixing device with a backplane and a support bracket. The backplane includes the first engaging part. The support bracket includes the second engaging part. The backplane is fixed on the display card. The support bracket is fixed on the circuit board. The first engaging part is engaged with the second engaging part to fix the display card to the circuit board.

Based on the above, the fixing device and the electronic device are engaged with each other by the backplane fixed on the display card and the support bracket fixed on the circuit board, to support the display card with the structural strength of the support bracket and share the gravity of the display card with the slot on the circuit board to avoid the slot being damaged by the gravity of the display card for a long time. Furthermore, the locking component is used to lock and fix the backplane and the support bracket to each other to limit the sliding of the display card relative to the support bracket. In this way, the display card is prevented from being detached from the circuit board due to the shake and sway of the electronic device during transportation and movement and resulting in damage to the display card.

These and other features, aspects and advantages of the present invention will become better understood with regard to the following description, appended claims, and accompanying drawings.

DETAILED DESCRIPTION OF THE EMBODIMENTS

The following will disclose a plurality of embodiments in the form of a diagram. For the sake of clarity, many practical details will be described together in the following description. However, it should be understood that these practical details should not be used to limit the present invention. That is to say, in some embodiments, these practical details are not necessary. In addition, in order to simplify the diagram, some conventional structures and components will be shown in a simple schematic way in the diagram.

Figure 1:
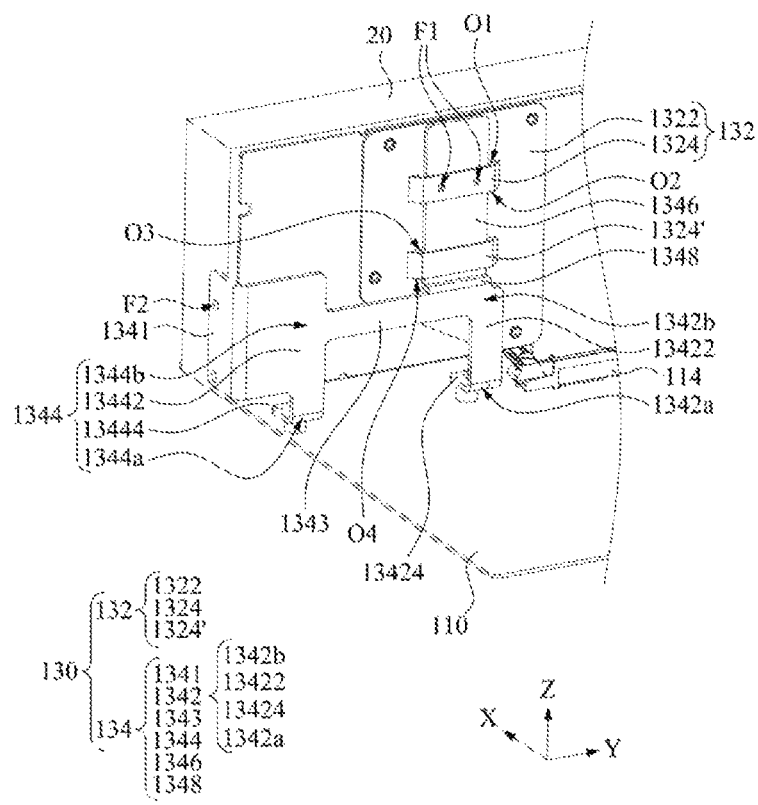
FIG. 1 is a perspective view showing an electronic device according to an embodiment.

Please refer to FIG. 1. FIG. 1 is a perspective view showing an electronic device 100 according to an embodiment. As shown in FIG. 1, in an embodiment, the electronic device 100 carries the display card 20 and includes a circuit board 110 and a fixing device 130. The display card 20 is fixed on the circuit board 110 by a fixing device 130. The fixing device 130 includes a backplane 132 and a support bracket 134.

The backplane 132 includes a substrate plate 1322 and two first engaging parts 1324, 1324'. The substrate plate 1322 is detachably fixed to the display card 20. The first engaging parts 1324, 1324' are connected to a side of the substrate plate 1322 away from the display card 20. In this embodiment, the first engaging parts 1324, 1324' are convex hulls formed by stamping the substrate plate 1322. The first engaging part 1324 has two openings O1, O2. The two openings O1, O2 are opposite to each other, and a connecting space is formed by the openings O1, O2 and the first engaging part 1324. Similarly, the first engaging part 1324' has two openings O3, O4. The two openings O3, O4 are opposite to each other, and a connecting space is formed by the openings O3, O4 and the first engaging part 1324'. The openings O1, O2, O3, and O4 are sequentially aligned along the direction Z.

In some embodiments, the substrate plate 1322 and the first engaging parts 1324, 1324' are separate members. In this embodiment, the first engaging parts 1324, 1324' are fixed to the substrate plate 1322 by welding or screwing.

The support bracket 134 includes two support legs 1342, 1344, a second engaging part 1346, a bending portion 1348, a hem 1341 and a connecting portion 1343. The support leg 1342 has a first end 1342a and a second end 1342b, and the support leg 1344 has a first end 1344a and a second end 1344b. The first ends 1342a and 1344a of the two support legs 1342 and 1344 are configured to connect to the circuit board 110. The second engaging part 1346 is coupled to the second end 1342b of the support leg 1342. Specifically, the bending portion 1348 is connected between the second engaging part 1346 and the second end 1342b of the support leg 1342, and is bent relative to the second engaging part 1346 and the support leg 1342. The second engaging part 1346 is coupled to the second end 1342b of the support leg 1342 via the bending portion 1348. In the embodiment, the second engaging part 1346 is a plate, and the second engaging part 1346 extends away from the circuit board 110 along the direction Z. The second engaging part 1346 passes through the openings O1, O2, O3, O4 and engages with the first engaging parts 1324, 1324'.

Figure 3:
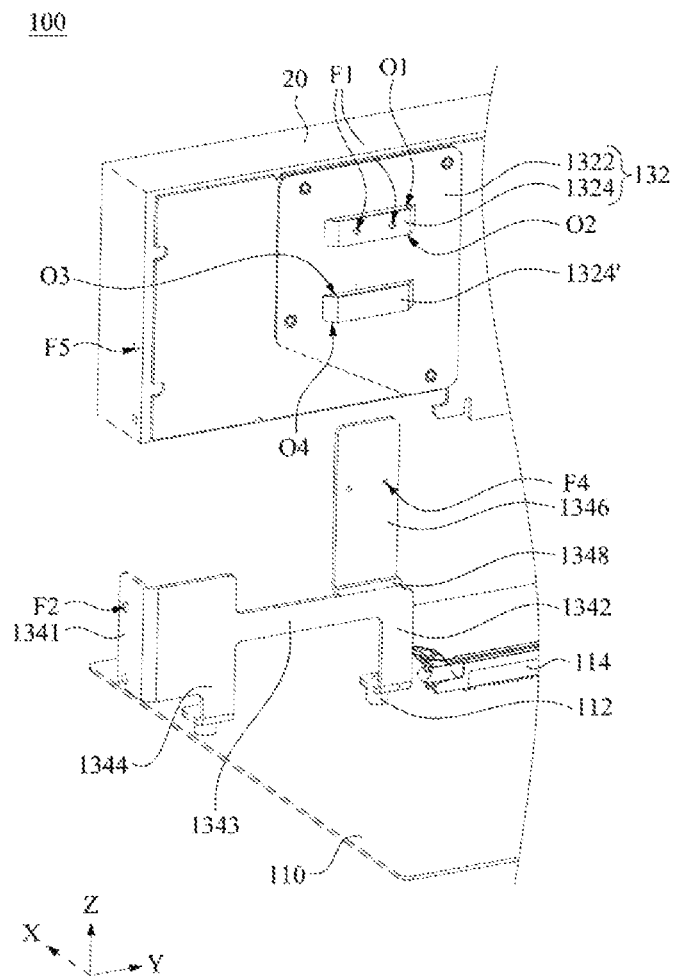
FIG. 3 is an assembly diagram showing a display card and a fixing device of FIG. 1.

Furthermore, the first engaging part 1324 has a locking hole F1. The second engaging part 1346 has a locking hole F4 (as shown in FIG. 3). When the second engaging part 1346 is engaged with the first engaging parts 1324, 1324', the locking hole F1 and the locking hole F4 are overlapped and connected. In this way, a locking component, such as a screw, is screwed into the locking hole F1 and the locking hole F4 to fix the first engaging part 1324 and the second engaging part 1346, for preventing the backplane 132 from separating from the support bracket 134 along the direction Z, and further preventing the display card 20 from separating from the circuit board 110.

In some embodiments, a first locking hole F1 is disposed on the first engaging part 1324'. In other embodiments, the two first engaging parts 1324, 1324' have the locking hole F1 respectively, and the locking hole F4 is provided on the second engaging part 1346 corresponding to the locking hole F1.

The connecting portion 1343 is connected between the two second ends 1342b and 1344b of the two support legs 1342 and 1344. The bending portion 1348 is connected to the connecting portion 1343. Specifically, the two support leg 1342, 1344 are arranged along the direction Y. The connecting portion 1343 extends along the direction Y and is connected between the two second ends 1342b, 1344b of the two support legs 1342, 1344. The bending portion 1348 also extends along the direction Y from the connecting portion 1343 to the second end 1342b of the support leg 1342 to connect with the connecting end 1343 and the second end 1342b of the support leg 1342.

Furthermore, the two support leg 1342, 1344 include support sections 13422, 13442 and bending sections 13424, 13444, respectively. The two support sections 13422 and 13442 extend between the corresponding first ends 1342a, 1344a and the second end 1342b, 1344b respectively. The bending sections 13424 and 13444 are located at the first ends 1342a, 1344a of the support legs 1342, 1344, respectively. The bending sections 13424, 13444 respectively connect to the support sections 13422, 13442, and bend toward the display card 20 relative to the support section 13422, 13442. As such, the bending section 13424, 13444 are located below the display card 20 in FIG. 1. Thereby, the space occupied by the display card 20 and the fixing device 130 on the circuit board 110 is saved.

In some embodiments, the bending sections 13424, 13444 are bent away from the display card 20 corresponding to the support sections 13422, 13442 respectively. In other embodiments, one of the two bending sections 13424, 13444 is bent away from the display card 20 relative to the corresponding support section 13422 or the support section 13442, and the other one of the two bending sections 13424, 13444 is bent towards the display card 20 relative to the corresponding support section 13422 or the support section 13442. In other words, the bending direction of the bending sections 13424, 13444 is flexibly adjustable according to actual needs, which is not limited herein.

Figure 2:
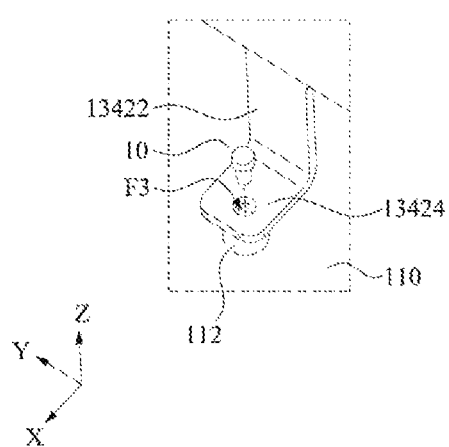
FIG. 2 is a partially enlarged view showing a support leg of FIG. 1.

Please refer to FIG. 2. FIG. 2 is a partially enlarged view showing a support leg 1342 of FIG. 1. In the embodiment, the support bracket 134 is fixed to the circuit board 110 by the support leg 1342, 1344. The following takes the support leg 1342 as an example to illustrate the fixing method of the support leg 1342 and the circuit board 110, and the same method is applied to the support leg 1344 in an embodiment.

As shown in FIG. 2, the bending section 13424 has a locking hole F3. A fixing column 112 is set on the circuit board 110. The fixing column 112 has a fixing hole (not shown in the figure due to visual angle). When fixing the support bracket 134, the locking hole F3 of the bending section 13424 is aligned with the fixing hole on the fixing column 112, and then the locking component 10 is passed through the locking hole F3 and the fixing hole, thereby, the support leg 1342 is fixed on the circuit board 110. The height of the fixing column 112 relative to the circuit board 110 is greater than the height of the electronic components on the circuit board 110 relative to the circuit board 110. In this way, when the support leg 1342 and 1344 are fixed on the circuit board 110, it prevents the support leg 1342 and 1344 from crushing the electronic components on the circuit board 110 and causing damage to the electronic components.

The fixing hole has an internal thread, and the locking component 10 is a screw. The locking component 10 is screwed into the locking hole F3 and the fixing hole, and is engaged with the internal thread of the fixing hole to fix the support leg 1342 and the fixing column 112, which is not limited herein. Other locking mechanisms or elements that can fix the support leg 1342 and the fixing column 112 are also applicable in this disclosure.

Please refer back to FIG. 1. The hem 1341 connects the support section 13442 of the support leg 1344. Specifically, the support section 13442 extends away from the support leg 1342 parallel to the direction Y. The hem 1341 is connected with a side of the support section 13442 away from the support leg 1342, and is bent to the display card 20 relative to the support section 13442. The hem 1341 has a locking hole F2. The display card 20 has a locking hole F5 (as shown in FIG. 3). When the second engaging part 1346 of the support bracket 134 is engaged with the first engaging part 1324 of the backplane 132, the locking hole F2 of the hem 1341 and the locking hole F5 of the display card 20 are overlapped and connected. In this way, the display card 20 and the hem 1341 are fixed to each other by the locking component passing through the locking hole F2 and the locking hole F5.

In an embodiment, the locking hole F5 has internal threads, and the locking component is a screw. The locking component is screwed into the locking hole F2 and the locking hole F5, and is engaged with the internal thread of the locking hole F5 to fix the display card 20 and the hem 1341, which is not limited herein. Other locking mechanisms or elements that can fix the display card 20 and the hem 1341 are also applicable in this disclosure.

Please refer to FIG. 3. FIG. 3 is an assembly diagram showing a display card 20 and a fixing device 130 of FIG. 1. As shown in FIG. 3, firstly, the two support leg 1342, 1344 are fixed on the fixing column 112 of the circuit board 110 by the locking component 10 (as shown in FIG. 2). On the other hand, the substrate plate 1322 is fixed to the display card 20 by a screw. Then, the second engaging part 1346 of the support bracket 134 is sequentially passed through the openings O4, O3 of the first engaging part 1324' and the openings O2, O1 of the first engaging part 1324, to engage with the two first engaging parts 1324, 1324'. Finally, the second engaging part 1346 and the first engaging part 1324 are fixed to each other by one locking component, and the hem 1341 and the display card 20 are fixed to each other by another locking components, as shown in FIG. 1.

In some embodiments, the backplane 132 and the support bracket 134 are metal sheet.

In some embodiments, the support bracket 134 is integrally formed by connecting the support legs 1342, 1344, the second engaging part 1346, the bending portion 1348, the hem 1341, and the connecting portion 1343.

In some embodiments, the number of the first engaging parts 1324, or the first engaging part 1324' is one or more, which is not limited herein.

In some embodiments, the number of the support legs 1342, 1344 is one or more, which is not limited herein.

Generally speaking, the circuit board 110 is placed upright when assembled in the host. In this way, the display card 20 is suspended because of no supported object below it, thus the gravity of the display card 20 is completely supported by the slot 114 on the circuit board 110. In this disclosure, the support bracket 134 supports and fixes the display card 20 to share the gravity borne by the slot 114, to avoid separation of the display card 20 and the slot 114 due to gravity. In addition, the load of the slot 114 is reduced, and the damage of the slot 114 and the circuit board 110 is also avoided. The bending portion 1348 further strengthens the support strength of the support bracket 134 and enhances the support effect. The locking hole F1, F4 helps to fix the support bracket 134 and the backplane 132, so as to prevent the display card 20 fixed on the backplane 132 from sliding out relative to the support bracket 134 in the direction Z and separating from the support bracket 134 due to shaking.

Figure 4:
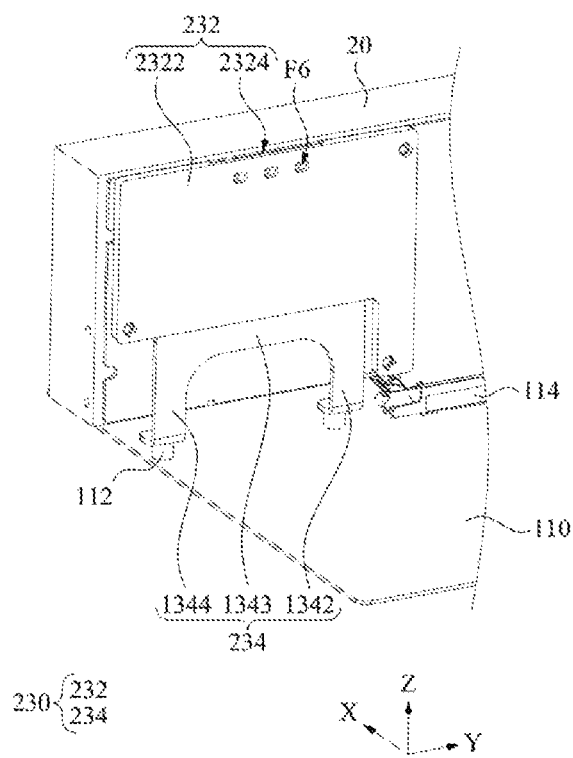
FIG. 4 is a perspective view showing an electronic device according to another embodiment.
Figure 5:
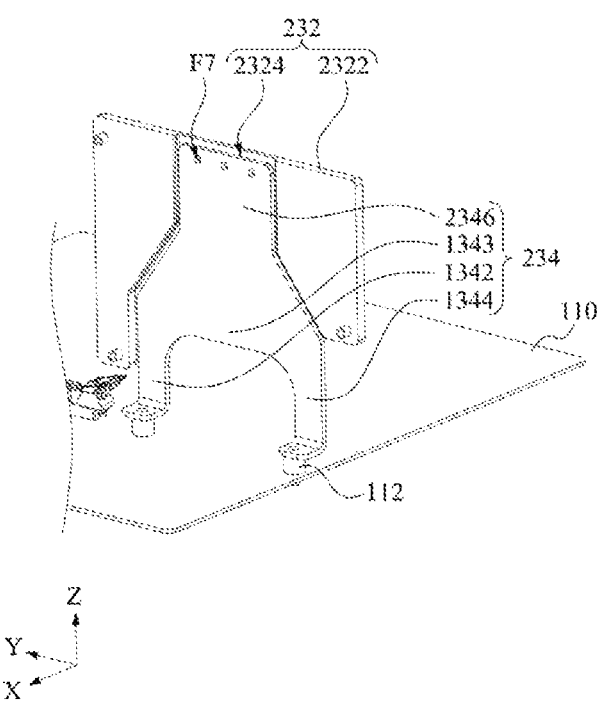
FIG. 5 is a perspective view showing the electronic device of FIG. 4 from another perspective.

Please refer to FIG. 4 and FIG. 5. FIG. 4 is a perspective view showing an electronic device 200 according to another embodiment. FIG. 5 is a perspective view showing the electronic device 200 of FIG. 4 from another perspective, in which the display card 20 is omitted and not shown.

As shown in FIG. 4, in this embodiment, the electronic device 200 carries a display card 20 and includes a circuit board 110 and a fixing device 230. The circuit board 110 includes a fixing column 112. The fixing device 230 includes a backplane 232 and a support bracket 234. The backplane 232 includes a substrate plate 2322 and a first engaging part 2324. The support bracket 234 includes two support legs 1342, 1344, a connecting portion 1343, and a second engaging part 2346 (as shown in FIG. 5). In this embodiment, the circuit board 110, the display card 20, the two support legs 1342, 1344, and the connecting portion 1343 are all the same as or similar to the embodiment shown in FIG. 1, which can be referred to the related instructions, and will not repeat them here. The difference between this embodiment and the embodiment shown in FIG. 1 is that the first engaging part 2324 of this embodiment is a groove.

Specifically, as shown in FIG. 5, the first engaging part 2324 is recessed relative to the substrate plate 2322 away from the display card 20 (please refer to FIG. 4) to form a groove. The second engaging part 2346 slides relative to the backplane 232 and snaps into the first engaging part 2324. Further, the first engaging part 2324 has a tapered profile, gradually tapering away from the circuit board 110. Correspondingly, the second engaging part 2346 has a tapered profile, gradually tapering away from the circuit board 110.

The tapered contours of the first engaging part 2324 and the second engaging part 2346 facilitate the snap-in alignment of the second engaging part 2346 and the first engaging part 2324, making assembly faster.

In this embodiment, the substrate plate 2322 has a locking hole F6 (as shown in FIG. 4). The second engaging part 2346 has a locking hole F7. When the second engaging part 2346 is engaged with the first engaging part 2324, the locking hole F6 and the locking hole F7 are overlapped and connected. Thereby, the locking component is passed through the locking hole F6 and the locking hole F7 to fix the second engaging part 2346 and the substrate plate 2322, to prevent the display card 20 from separating from the support bracket 234 in direction Z.

Moreover, in the embodiment, the bending portion 1348 and the hem 1341 are selectively omitted. However, in some embodiments, the bending portion 1348 and the hem 1341 are also applicable to the embodiments shown in FIG. 4 and FIG. 5, which is not limited herein.

Figure 6:
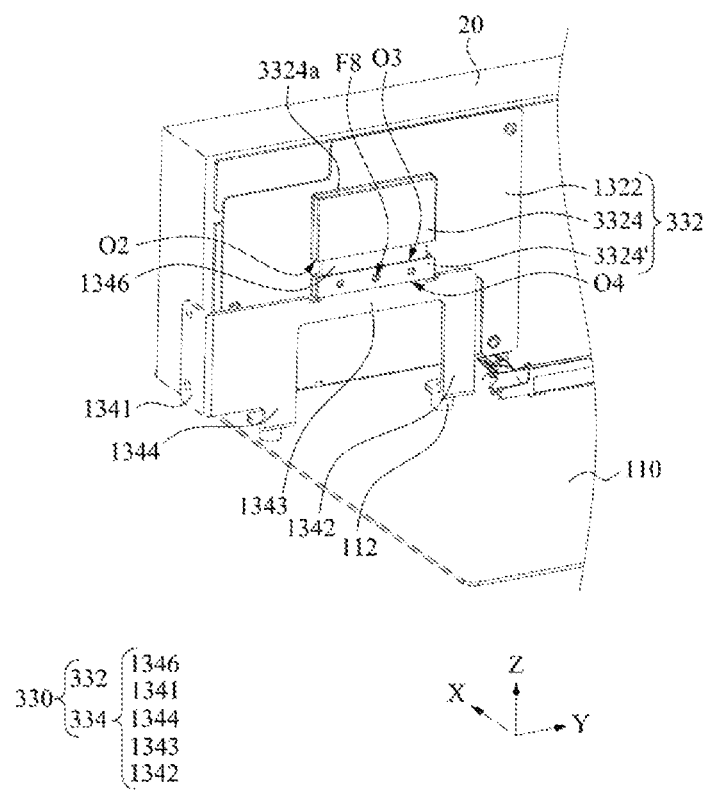
FIG. 6 is a perspective view showing an electronic device of another embodiment.

Please refer to FIG. 6. FIG. 6 is a perspective view showing an electronic device 300 of another embodiment.

As shown in FIG. 6, in an embodiment, the electronic device 300 carries the display card 20 and includes a circuit board 110 and a fixing device 330. The circuit board 110 includes a fixing column 112. The fixing device 330 includes a backplane 332 and a support bracket 134. The backplane 332 includes a substrate plate 1322 and first engaging parts 3324, 3324'. The support bracket 334 includes a hem 1341, a support legs 1342, 1344, a connecting portion 1343, and a second engaging part 1346. The embodiment shown in FIG. 1 is that the circuit board 110, the display card 20, the substrate plate 1322, the hem 1341, the support legs 1342, 1344, the connecting portion 1343, and the second engaging part 1346 are all the same as or similar to the embodiment shown in FIG. 1, which can be referred to the related instructions, and will not repeat them here. The difference between this embodiment and the embodiment shown in FIG. 1 is that the first engaging part 3324 shown in FIG. 6 includes a stopping part 3324a, and the first engaging part 3324' has a locking hole F8.

The stopping part 3324a is opposite to the opening O2. The second engaging part 1346 passes through the openings O3 and O4 of the first engaging part 3324' and the opening O2 of the first engaging part 3324, and engages with the first engaging parts 3324 and 3324'. The stopping part 3324a stops the second engaging part 1346 in direction Z.

The second engaging part 1346 also has a locking hole (not shown in the figure due to visual angle). The locking hole of the second engaging part 1346 and the locking hole F8 of the first engaging part 3324' are overlapped and connected. In this way, the locking component is passed through the locking hole of the second engaging part 1346 and the locking hole F8 of the first engaging part 3324' to fix the second engaging part 1346 and the first engaging part 3324'.

From the above detailed description of the specific embodiments, it is clearly seen that the fixing device and the electronic device are engaged with each other by the backplane fixed on the display card and the support bracket fixed on the circuit board, to support the display card with the structural strength of the support bracket and share the gravity of the display card with the slot on the circuit board to avoid the slot being damaged by the gravity of the display card for a long time. Furthermore, the locking component is used to lock and fix the backplane and the support bracket to each other to limit the sliding of the display card relative to the support bracket. In this way, the display card is prevented from being detached from the circuit board due to the shake and sway of the electronic device during transportation and movement and resulting in damage to the display card.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A fixing device, for fixing a display card on a circuit board, comprising:
    a backplane, comprising:
    a substrate plate, fixed on the display card; and
    a first engaging part, disposed on the substrate plate; and
    a support bracket, comprising:
    at least one support leg, including a first end and a second end, the first end is configured to connect with the circuit board; and
    a second engaging part, connected with the second end and engaged with the first engaging part;
    wherein the support leg further comprises:
    a support section, extending between the first end and the second end; and
    a bending section, connected with the support section and bent relative to the support section, the bending section is located at the first end of the support leg and has a first locking hole;
    wherein the support bracket further includes a hem, the hem is connected with the support section and bent toward the display card relative to the support section, and the hem has a second locking hole.

2. The fixing device according to claim 1, wherein the support bracket further includes a bending portion, the bending portion is connected between the second engaging part and the second end of the support leg, and is bent relative to the support leg and the second engaging part.

3. The fixing device according to claim 1, wherein the number of the support leg is two, and the support bracket further includes a connecting portion connected between the support legs.

4. The fixing device according to claim 1, wherein the hem and the bending section are bent in the same direction relative to the support section.

5. The fixing device according to claim 1, wherein the second engaging part is a plate.

6. The fixing device according to claim 1, wherein the first engaging part has a third locking hole, the second engaging part has a fourth locking hole, and when the second engaging part and the first engaging part are engaged, the third locking hole and the fourth locking hole are overlapped and connected.

7. The fixing device according to claim 1, wherein the first engaging part is a groove.

8. An electronic device, with a display card, the electronic device comprising:
    a circuit board; and
    a fixing device, including a backplane and a support bracket, the backplane includes a first engaging part, the support bracket includes a second engaging part;
    wherein, the backplane is fixed on the display card, the support bracket is fixed on the circuit board, and the first engaging part is engaged with the second engaging part to fix the display card to the circuit board;
    wherein the first engaging part is a convex hull, and the convex hull has two openings opposite each other, the second engaging part is engaged with the first engaging part through the openings.

9. The electronic device according to claim 8, wherein the support bracket further includes a bending portion and at least one support leg, the bending portion is connected between the second engaging part and a second end of the support leg, and is bent relative to the support leg and the second engaging part.

10. The electronic device according to claim 9, wherein the number of the support leg is two, and the support bracket further includes a connecting portion connected between the two support legs.

11. The electronic device according to claim 9, wherein the support leg further comprising:
    a support section, extending between a first end and the second end of the support leg; and
    a bending section, connecting the support section and bent relative to the support section, the bending section is located at the first end of the support leg and has a first locking hole.

12. The electronic device according to claim 11, wherein the support bracket further includes a hem, the hem is connected with the support section and bent toward the display card relative to the support section, and the hem has a second locking hole.

13. The electronic device according to claim 12, wherein the hem and the bending section are bent in the same direction relative to the support section.

14. The electronic device according to claim 8, wherein the second engaging part is a plate.

15. The electronic device according to claim 8, wherein the first engaging part has a first locking hole, the second engaging part has a second locking hole, and the first locking hole and the second locking hole are overlapped and connected when the second engaging part and the first engaging part are engaged.

16. A fixing device, for fixing a display card on a circuit board, comprising:
    a backplane, comprising:
    a substrate plate, fixed on the display card; and
    a first engaging part, disposed on the substrate plate; and
    a support bracket, comprising:
    at least one support leg, including a first end and a second end, the first end is configured to connect with the circuit board; and
    a second engaging part, connected with the second end and engaged with the first engaging part;
    wherein the first engaging part is a convex hull, and the convex hull has two openings opposite each other, the second engaging part is engaged with the first engaging part through the openings.

* * * * *